(12) United States Patent
Boskamp

(10) Patent No.: US 6,313,633 B1
(45) Date of Patent: Nov. 6, 2001

(54) MAGNETIC RESONANCE IMAGING HEAD COIL

(75) Inventor: Eddy B. Boskamp, Menomonee Falls, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/469,434

(22) Filed: Dec. 27, 1999

(51) Int. Cl.[7] ................................................. G01V 3/00
(52) U.S. Cl. ............................ 324/319; 324/318; 324/322
(58) Field of Search ................................... 324/319, 318, 324/322, 300, 314, 312

(56) References Cited

U.S. PATENT DOCUMENTS

| | | | |
|---|---|---|---|
| 5,309,104 | * | 5/1994 | Frederick ................................ 324/300 |
| 5,602,479 | * | 2/1997 | Srinivasan ............................. 324/318 |
| 5,619,996 | * | 4/1997 | Bernstein ............................. 128/653.5 |
| 5,689,189 | * | 11/1997 | Morich et al. ......................... 324/318 |
| 5,999,000 | * | 12/1999 | Srinivasan ............................. 324/318 |
| 6,029,082 | * | 2/2000 | Srinivasan et al. .................... 600/422 |
| 6,100,691 | * | 8/2000 | Yeung ................................... 324/318 |

\* cited by examiner

*Primary Examiner*—Jay Patidar
*Assistant Examiner*—Brij B. Shrivastav
(74) *Attorney, Agent, or Firm*—Irving M. Freedman; Christian G. Cabou; Phyllis Y. Price

(57) ABSTRACT

A short radio frequency coil for magnetic resonance imaging of the head to provide a homogeneous magnetic field including parallel conductors forming a first cylindrical portion with end rings supporting the conductors which then continue at an angle to form the frustum of a cone and further continuing to form a reduced diameter second cylindrical portion. A third conductive end ring of reduced diameter positioned at the open end of the second cylindrical portion supports the end of the conductors and provides a reduced diameter opening. An asymmetrical coil surrounds portions of the radio frequency coil including the first cylindrical and frustum of a cone portions.

18 Claims, 2 Drawing Sheets

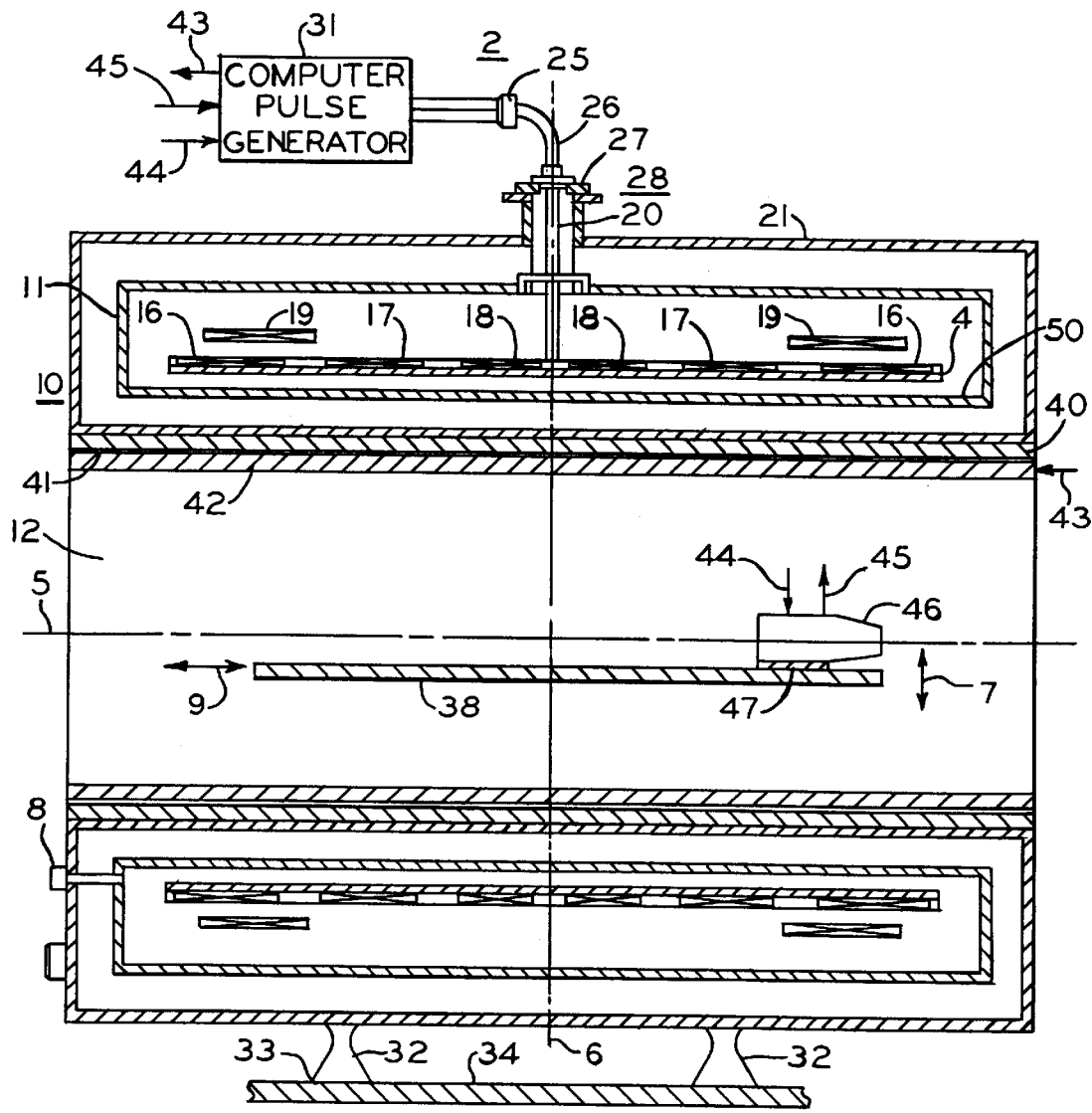
FIG_1

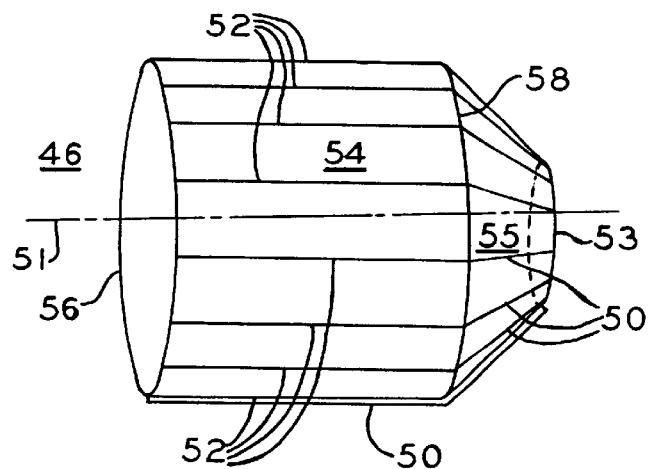
FIG_2
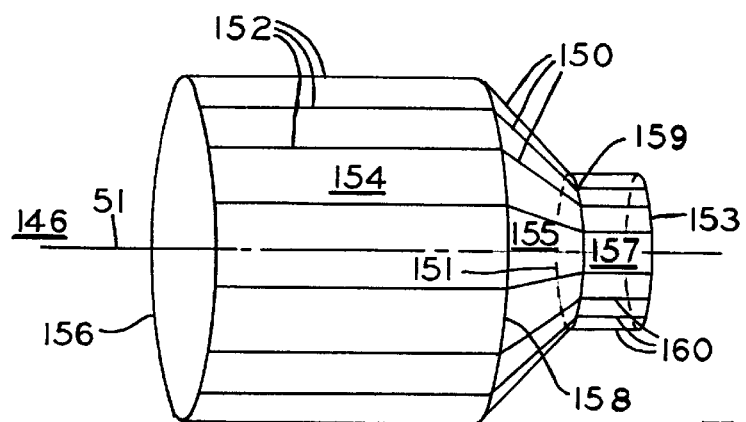
FIG_3
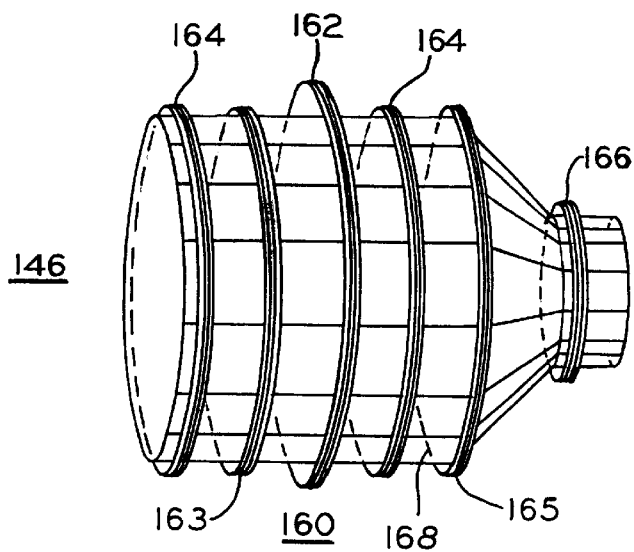
FIG_4

MAGNETIC RESONANCE IMAGING HEAD COIL

BACKGROUND OF INVENTION

This invention relates to a magnetic resonance imaging system (hereinafter called "MRI"), and more particularly to a short head coil apparatus for imaging the human head or brain.

As is well known, a superconducting magnet can be made superconducting by placing it in an extremely cold environment, such as by enclosing it in a cryostat or pressure vessel containing liquid helium or other cryogen. The extreme cold ensures that the magnet coils are superconducting, such that the coils can be operated in persistent mode, that is, a power supply can be connected for a short time to start current flowing through the coils, then a superconducting switch can be closed, the power supply removed, and the current will continue to flow, thereby maintaining the coil current and resultant magnetic field. Superconducting magnets find wide application in the field of MRI.

In a typical MRI magnet, the main superconducting magnet coils are enclosed in a cylindrical cryogen pressure vessel, contained within a vacuum vessel and forming an imaging bore in the central region. The main magnet coils develop a strong magnetic field in the imaging bore.

However, it is necessary for acceptable quality imaging to provide and maintain a strong homogeneous magnetic field in the imaging region. Typical field strengths of 0.5 to 1.5 T (Tesla) require homogeneity of 10 parts per million (ppm) over volumes on the order of a 45 cm diameter sphere.

In MRI imaging a plurality of additional magnetic fields are added in order to shape the imaging magnetic field and to conduct MRI operation. These include radio frequency (hereinafter called "RF") signals and include pulsed magnetic field gradients to spatially encode the nuclear magnetic resonance (NMR) signal from various portions of an anatomical region of interest. The pulsed magnetic field gradients together with RF excitation of the nuclear spins. and acquisition of signal information are commonly referred to as pulse sequences. Pulsing current through conductors generate pulsing magnetic fields external to the conductors which can interfere with other magnetic fields in the superconducting magnet including the homogeneity of the main magnetic field in the imaging volume, and adversely affect imaging quality.

It is known in the imaging of the human head and brain to utilize a head coil or additional coil assembly, positioned around the head during imaging. The separated parallel conductors of such head coils has led to their being called birdcages.

RF head coils are applied to generate a uniform RF magnetic field over the brain. In general these head coils are very long, and continue past the apex of the patient's head. Since the signal to noise ratio is proportional to the square root of the Quality factor of the loaded coil divided by the effective volume, which is a volume integral of the RF energy stored in the coil, it is important to limit the size of RF coils and keep them as small as possible while at the same time providing the necessary MRI signals. However, this has to be done while maintaining the RF magnetic field homogeneity of the coils for equal flip angle distribution during transmit pulses and equal sensitivity during receive.

Attempts to shorten the RF head coil have not proven entirely satisfactory, providing for example hot spots or areas of high B1 amplitude which disrupt the RF magnetic field homogeneity and the imaging quality.

SUMMARY OF INVENTION

Thus, there is a particular need for a short RF head coil which overcomes the aforementioned problems and which truly maintains homogeneity.

In accordance with one embodiment of the invention a short radio frequency coil for surrounding and magnetic resonance imaging of the human head includes a birdcage structure formed by a plurality of parallel conductors. The conductors first form a cylindrical portion about the axis followed by a tapered portion in the shape of a frustum of a cone having an opening at the apex of the frustum which is smaller than that of the cylindrical portion about the axis. The conductors then extend at a different angle to form a second smaller diameter cylindrical portion. Conductive circular end rings support the parallel conductors at the open ends of the cylinders.

An asymmetrical coil assembly may surround the first cylinder and extend to the tapered portion of the conductors. The coil in the central region of the asymmetrical coil assembly is of a larger diameter than the end coils of the coil assembly. The resultant improved homogeneity in the magnetic field provides improved quality imaging. The head coil may be pulsed by the transmit coil of the magnetic resonance imager or alternatively may act as a receiver coil for transmit pulses from the transmit coil surrounding the interior of the bore of the superconducting magnet.

DESCRIPTION OF DRAWINGS

FIG. 1 is a simplified cross-sectional view of a superconducting magnet incorporating the invention.

FIG. 2 is an enlarged perspective view of the head coil of FIG. 1.

FIGS. 3 and 4 show an alternate head coil configuration.

DETAILED DESCRIPTION OF PREFERRED EMBODIMENTS OF INVENTION

Referring first to FIG. 1, MRI superconducting magnet assembly 10 includes cryogen pressure vessel 11 positioned concentrically within vacuum vessel 21 and forming central imaging bore 12 about axis 5. Positioned within pressure vessel 11 is composite drum 4 with axially spaced main magnet coils 16 wound in axial slots on the drum. Correction coils 17. 18 and 19 within pressure vessel 11 enable shimming of the magnetic field in bore 12 to improve magnetic field homogeneity to acceptable limits. Supports 32 secure superconducting magnet assembly 10 on floor 34.

External electrical power and control connections are provided through access port 28 by lead assembly 26 which includes connector 25 outside vacuum vessel 23 and conduit 20 passing through plate 27 for electrical connection of mechanical leads or wires to the components including magnet coils 16, 17, 18, 19 and 21 within cryogen pressure vessel 11.

Positioned within bore 12 of superconducting magnet 10 is patient support 38 which is moveable within the bore as indicated by arrows 7 and 9. A head coil 46 is positioned at one end of patient support 38 on mounting member 47 secured to the patient support. A patient (not shown) lying on patient support 44 would be positioned with the patient's head being imaged within head coil 46. 1 lead coil 46 is described in detail below.

Surrounding the central bore of vacuum vessel 21 is RF assembly 40, 41, 42 including gradient coil 40 and transmit coil 42 separated by RF shield 41.

Computer pulse generator 31 external to vacuum vessel 21 provides and receives appropriate signals and control action for superconducting magnet 10 and magnetic resonance imaging system 2 in a manner well known in the art. These include appropriate RF pulses for gradient coil 40, transmit pulse 43 for transmit coil 42; and transmit pulse 44 for head coil 46 and/or receive signal 45 from the head coil as desired. That is, head coil 46 when used for imaging of the head may be provided with a transmit RF pulse, or alternatively, the head coil may act as the receive coil to receive the imaging signal resulting from the transmit pulse being supplied to transmit coil 42. Pulses 42–45 are indicated by arrows in FIG. 1.

Referring next to FIG. 2, head coil 46 includes a so-called birdcage configuration of conductors which would be encased or embedded in a suitable fiberglass epoxy plastic housing 50, a portion of which is shown in FIG. 2. A plurality of axially extending parallel conductors or rods 52 form a cylindrical portion 54 supported at the ends by circular end rim conductors 56 and 58. Conductors 52, 56 and 58 are copper and in one application are strips ½ inch wide. Tile diameter of circular conductors 56 and 58 is 23 centimeters.

Axial conductors 52 extend beyond circular end conductor 58 at a 45° angle towards axis 51. Angular portions 50 of conductors 52 do not meet at axis 51 or at any point, but rather the conductors terminate at reduced size circular conductor 53 forming an opening with a diameter of 10 centimeters, and tapered portion 55 in the shape of the frustum of a circular cone. The patients head would be positioned through circular end ring 56 into cylindrical portion 54 while imaging.

The resulting birdcage configuration thus includes a tubular or cylindrical portion 54 and a tapered or conical portion 55 terminating at end ring or support 53 which includes an opening smaller than tubular end ring 56 at the opposite end. The ratio of the diameters of the rings is preferably in the range of 0.4 to 0.6. In one application tubular portion 54 is 14.6 inches long with a diameter of 23 inches and tapered portion 55 extends axially for 5 inches terminating in end ring 53 with a diameter of approximately one-half that of cylinder 54 end ring 56.

The number of rods 52 may vary and may, by way of example, be eight or more rods equally angularly spaced about axis 51.

If end ring 53 is too close to the head of the patient being imaged, it has been found that high spots (high B1 amplitude) will occur where the end ring is close to the tissue of the patient. The birdcage configurations of the subject invention prevents such high spots and thus provides improved magnetic field homogeneity and imaging quality.

Referring to FIG. 3, birdcage 146 includes first cylindrical portion 154 and tapered portion 155 formed by axially extending conductors 152. However, conductive end ring 153 is further displaced from circular conductive end rings 156 and 158 and axial angle conductor portions 150 of conductors 152 are further bent to extend axially about axis 151 to form second cylindrical portion 157 which terminates at end ring 153. The circular area of transition 159 from angular conductors 150 to axial conductors 160 to form second cylindrical portion 157 does not include a conductive connecting ring similar to end ring 53 of FIG. 2, but may include a non-conductive support ring shown dotted in FIG. 3. The axial length of second cylinder portion 157 is chosen such that the resulting apex image is uniform, and in one application is 3.5 centimeters long axially. For a vertical Direct Current (DC) magnet field along the Y or vertical direction, birdcage 146 can be driven in the linear mode to generate the B1 magnetic field in the X or horizontal direction. End ring 53 prevents axial conductors 152 meeting at a point which it has been found also provides magnetic field high spots which would detract from imaging quality. In addition, the displacement of end ring 153 away from the patient's head in cylindrical portion 154 results in improved homogeneity with the axial displacement being selected to provide a uniform apex image.

While FIGS. 2–4 show a circular cross section for the uniform and tapered portions non-circular cross sections such as, by way of example, an ellipse, or a flatted circle may be used.

FIG. 4 shows an asymmetric solenoid coil assembly 160 applied around birdcage 146 to generate the B1 magnetic field component in the Z direction. Center coil 162 of coil assembly 160 has a slightly bigger radius than the other turns or loops 164 to maintain uniformity close to the conductors. The last coil 166 over the tapered end of birdcage 146 has a smaller diameter than the others, such that coil assembly 160 can be truncated and kept short while maintaining homogeneity equal to a much longer solenoid. Coils 162–166 are connected in series as indicated schematically by connection 168.

While the present invention has been described with respect to certain preferred embodiments thereof. it is to be understood that numerous variations in the details of construction, the arrangement and combination of parts, and the types of materials used may be made without departing from the spirit and scope of the invention.

What is claimed is:

1. A short radio frequency coil for the magnetic resonance imaging of the head without magnetic hot spots comprising:

a plurality of spaced conductors positioned about an axis forming a first substantially cylindrical shaped portion around said axis;

a first circular conductor having a first diameter and a second circular conductor having a second diameter equal to that of said first circular conductor, said first and second circular conductors supporting the ends of the axial conductors forming said cylindrical portion;

said axial conductors extending linearly beyond one of said circular conductors at an angle to extend inward toward and spaced from said axis along a portion of generally conical shape;

the extending portion of said conductors forming a second portion having the shape of the frustum of a right cone; and a third circular conductor having a smaller diameter than said first and second circular conductors securing the ends of said extending portion of said conductors;

said conductors forming said head coil with a generally circular opening at each end, and a first cylindrical portion connected to a second conical portion;

said cylindrical portion being large enough to surround the head being imaged during said magnetic resonance imaging.

2. The magnetic resonance imaging head coil of claim 1 wherein a third circular conductor supports the ends of said conductors forming said conical portion, said third circular conductor being remote from said first cylindrically shaped portion.

3. The magnetic resonance imagine head coil of claim 2 wherein there are at least eight equally angularly spaced conductors.

4. A short radio frequency coil for the magnetic resonance imaging of the head comprising:

a plurality of spaced conductors positioned about an axis forming a first substantially cylindrical shaped portion around said axis;

at least two circular conductors each of which supports the ends of the axial conductors forming said cylindrical portion;

said axial conductors extending beyond one of said circular conductors at an angle to extend inward along a portion of generally conical shape;

the extending portion of said conductors forming the shape of the frustum of a cone; and a third circular conductor having a smaller diameter than said two circular conductors securing the ends of said extending portion of said conductors;

said conductors forming said head coil with a generally circular opening at each end; wherein said extending portions of said conductors extend at an angle further beyond said frustum of a cone, about said axis forming a second reduced diameter cylinder remote from said first cylinder.

5. The magnetic resonance imaging head coil of claim 4 wherein a non-conductive support supports said conductors at the junction of said conical portion and said second cylinder.

6. The magnetic resonance imaging head coil of claim 4 wherein an asymmetric coil assembly including a plurality of series connected coils surrounds said first cylinder and said frustum of a cone of said head coil.

7. The magnetic resonance imaging head coil of claim 6 wherein said asymmetric solenoid includes one or more coils in the central region of said first cylinder which is of a larger diameter than the diameter of the coils at the ends of said first cylinder.

8. The magnetic resonance imaging head coil of claim 6 wherein said asymmetrical coil assembly extends around said first cylindrical portion, and the remote end of said asymmetrical coil assembly surrounds the junction between said tapered portion and said second cylindrical portion with a coil of a smaller diameter than any of the coils around said first cylinder, and the ratio of the coil diameters being in the range of 0.4 to 0.6.

9. The magnetic resonance imaging head coil of claim 8 wherein said asymmetrical coil assembly generates a B1 magnetic field in the Z direction.

10. A short radio frequency head coil for magnetic resonance imaging comprising:

a birdcage like structure of conductors extending about the axis thereof in the axial direction;

said conductors forming a first tubular portion and a tapered portion about an axis;

said tapered portion formed by straight conductors at an angle to said tubular portion and terminating at an opening around said axis smaller than said tubular portion; and two circular support conductors forming an opening at both ends ends of said conductors of said tubular portion;

said tubular portion being large enough to surround the head of a person being imaged;

the ratio of the diameter of the smaller opening to the openings at the ends of said tubular portion being in the range of 0.4 to 0.6.

11. The short head coil of claim 10 wherein said tubular portion of said birdcage like structure is circular in cross section forming a first cylinder.

12. The short head coil of claim 11 wherein said tapered portion of said birdcage like structure is in the shape of a right frustum of a cone.

13. A short radio frequency head coil for magnetic resonance imaging comprising:

a birdcage like structure of conductors extending about the axis thereof in the axial direction;

said conductors forming a first tubular portion and a tapered portion;

said tapered portion being at an angle to said tubular portion and terminating at an opening smaller than said tubular portion; and end support conductors forming an opening at the ends of said conductors;

said tubular portion being large enough to surround the head of a person being imaged;

said tubular portion of said birdcage like structure is circular in cross section forming a first cylinder;

said tapered portion of said birdcage like structure is in the shape of a frustrum of a cone; and wherein said frustum of a cone tapers down to a circular opening; and wherein said axial conductors extend beyond said frustrum of a cone to form a second cylinder at the end of said frustrum of a cone remote from said first cylinder.

14. The short head coil of claim 13 wherein there is a conductive end ring at the end of said cylinder remote from said tapered portion to which said conductors are secured and which is smaller than the end ring at the remote end of said first cylinder.

15. The short head coil of claim 14 wherein an asymmetric coil assembly of a plurality of series connected coils surrounds at least portions said birdcage structure.

16. The short head coil of claim 15 wherein the coil in the central region of said asymmetric coil assembly has a larger diameter than said series connected coils toward the ends thereof.

17. The short head coil of claim 16 wherein said head coil is positioned on a patient support in the bore of a superconducting magnet of a magnetic resonance imager, and wherein a transmit coil is positioned around the bore of said superconducting magnet for patient imaging, and a pulse generator is provided for generating transmit pulses for selective application to the group consisting of said transmit coil and said head coil.

18. The short head coil of claim 17 wherein said transmit pulses are applied to said transmit coil and said head coil is utilized as a signal receiver to provide a receive signal for imaging.

\* \* \* \* \*